[12] United States Patent
Gappisch et al.

(10) Patent No.: US 7,664,998 B2
(45) Date of Patent: Feb. 16, 2010

(54) NON-VOLATILE MEMORY AND ACCELERATED TEST METHOD FOR ADDRESS DECODER BY ADDED MODIFIED DUMMY MEMORY CELLS

(75) Inventors: Steffen Gappisch, Zurich (CH); Georg Farkas, Binz (CH)

(73) Assignee: NXP B.V., Eindhoven (NL)

( * ) Notice: Subject to any disclaimer, the term of this patent is extended or adjusted under 35 U.S.C. 154(b) by 131 days.

(21) Appl. No.: 10/481,976

(22) PCT Filed: Jun. 28, 2002

(86) PCT No.: PCT/IB02/02489
§ 371 (c)(1),
(2), (4) Date: Dec. 23, 2003

(87) PCT Pub. No.: WO03/003379
PCT Pub. Date: Jan. 9, 2003

(65) Prior Publication Data
US 2004/0188716 A1    Sep. 30, 2004

(30) Foreign Application Priority Data
Jun. 29, 2001    (EP) .................................. 01115963

(51) Int. Cl.
G11C 29/00 (2006.01)
H01L 29/94 (2006.01)
G11C 17/00 (2006.01)
(52) U.S. Cl. ...................... 714/718; 714/720; 257/296; 257/390; 365/94; 365/201
(58) Field of Classification Search .................. 714/718, 714/720; 257/296, 390; 365/94, 201
See application file for complete search history.

(56) References Cited

U.S. PATENT DOCUMENTS

| 4,429,388 | A | * | 1/1984 | Fukushima et al. | .......... 714/718 |
| 5,280,451 | A | * | 1/1994 | Akaogi | .................. 365/185.04 |
| 5,606,193 | A | * | 2/1997 | Ueda et al. | .................. 257/390 |
| 5,995,439 | A | * | 11/1999 | Watanabe et al. | ...... 365/230.03 |
| 6,301,158 | B1 | * | 10/2001 | Iwahashi | ................ 365/185.23 |

(Continued)

FOREIGN PATENT DOCUMENTS

JP    63-152100 A    6/1988

(Continued)

OTHER PUBLICATIONS

Mitsumoto, Toshio, English Translation from JPO website of JP 05189988 A. pp. 1-9.*

*Primary Examiner*—John J Tabone, Jr.

(57) ABSTRACT

A modification of a predetermined, memory-size-dependant number of nonvolatile memory cells turns them into ROM cells with a fixed content pattern. Since these additional ROM cells do not require much effort during manufacturing and use only small additional space on the memory chip or the integrated circuit, but provide significant advantage for testing. When using pairs of essentially symmetrical non-volatile memory cells, each pair having a common bit line, the removal or interruption of this bitline contact may serve to impress a fixed value, e.g. a '0', into this pair and vice versa. During test, a simple and therefore only minimal time requiring pattern, preferably a checkerboard pattern, is written into and read from the non-volatile memory, allowing a quick determination of the decoders' correct function.

5 Claims, 3 Drawing Sheets

U.S. PATENT DOCUMENTS

Figure 1:
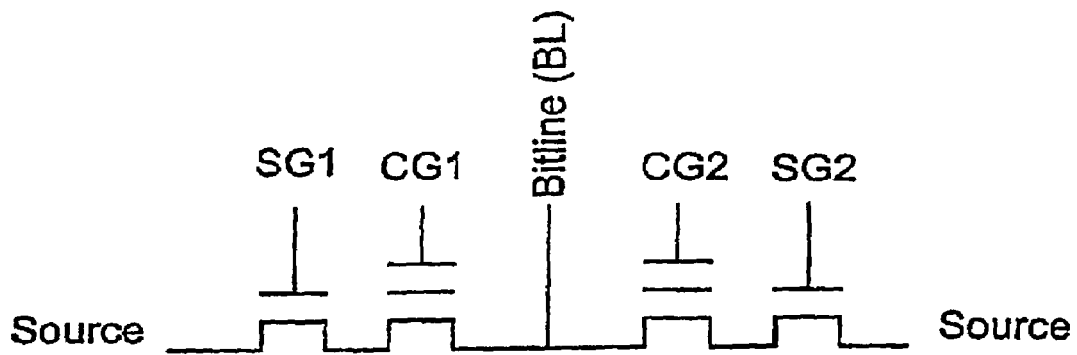

2003/0189858 A1 * 10/2003 Sowards et al. ............ 365/200

FOREIGN PATENT DOCUMENTS

| JP | 4-370600 A | 12/1992 |
| JP | 05063162 A * | 3/1993 |
| JP | 05189988 A * | 7/1993 |
| JP | 05282876 A * | 10/1993 |

* cited by examiner

NON-VOLATILE MEMORY AND ACCELERATED TEST METHOD FOR ADDRESS DECODER BY ADDED MODIFIED DUMMY MEMORY CELLS

The present invention relates to the structure and design of a non-volatile memory with its integrated decoder. Such memories are often embedded with associated microprocessor on ICs to be used in mobile phones, personal digital assistants, in GPS applications for automobile or other navigation purposes.

Integrating a decoder with its non-volatile memory leads to certain problems that have to be solved before such integration exhibits the expected advantages. One of the issues is that the test time, i.e. the total time to conduct the tests necessary for establishing sufficient and reliable working of the memory/decoder combination is rather long within the mass production process. Because of this "testing bottleneck" during manufacturing, it is highly desirable to reduce the total test time for such a memory/decoder combination.

Examples for such memories are described e.g. in U.S. Pat. No. 5,214,604 to Kato or U.S. Pat. No. 5,357,471 to Alapat. The latter, i.e. the Alapat U.S. patent, describes an architecture for a memory in which an extra row and extra column of memory cells are added to the regular memory array. The extra column is configured so that, during a first test cycle, a sense device connected to the column line of the extra column detects whether exactly the row line with the correct address or parity is selected when a particular row address is entered. Similarly, the extra row of cells is configured so that, during a second test cycle, a sense device connected to the column lines of the regular array will determine whether exactly the column line with the correct address or parity is selected when a particular column address is entered. The row decoder and the row address lines are tested separately from the column decoder and column address lines.

Though the Alapat arrangement shows an interesting solution, it still has shortcomings when applied to a design according to the present invention, as will be explained further down.

Further, low supply voltages—which are preferable for other reasons—make Fowler-Nordheim tunneling necessary as the programming mechanism. As a result, the programming time for a single memory cell is comparatively long, i.e. in the range of ms. The large number of program steps, which reflects the number of memory cells, results in significant total times to be spent for the testing of a whole memory. Overall, the testing of the decoders is a very time consuming stage within the non-volatile memory test process. It is thus a main object of this invention to reduce the necessary testing time for non-volatile memories, in particular the testing of the decoders of such a non-volatile memory.

Figure 3:
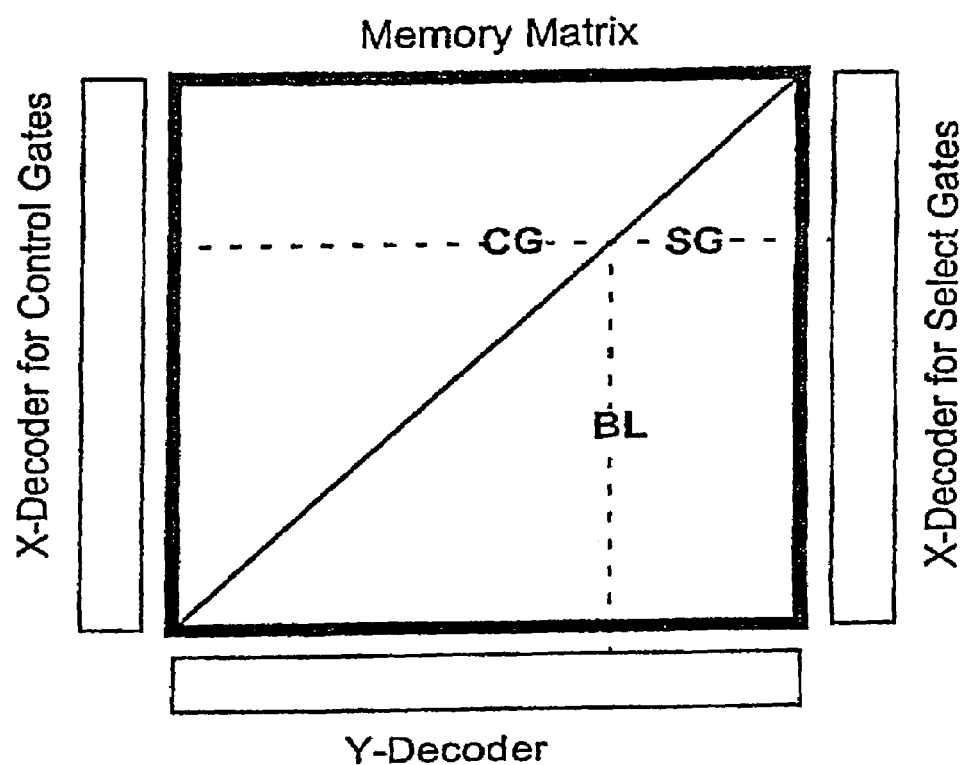

Typically a diagonal within the non-volatile memory's matrix—see FIG. 3—is programmed for this testing purpose, as known in the art. However, even with such a testing approach, the time necessary for testing is unsatisfactory. This shall be illustrated by the following example.

Assumed is a memory of 16 Mb size, resulting in 4096 memory rows. In order to program a diagonal, every row has to be programmed separately. If programming of a single cell takes just 5 ms, programming a diagonal would consume 5 ms*4096=20 s of total test time. Considering the high cost and the therefore desired and economically necessary throughput of modern testers, a test time of more than 20 seconds for just programming this diagonal with the Fowler-Nordheim mechanism is absolutely unacceptable.

Here, the present invention provides a solution. In short, the invention solves the problem by providing within the non-volatile memory specifically designed additional cells, whose design and function significantly shortens the required test time for such a memory, resulting in a greatly improved and optimized use of the tester.

Figure 2:
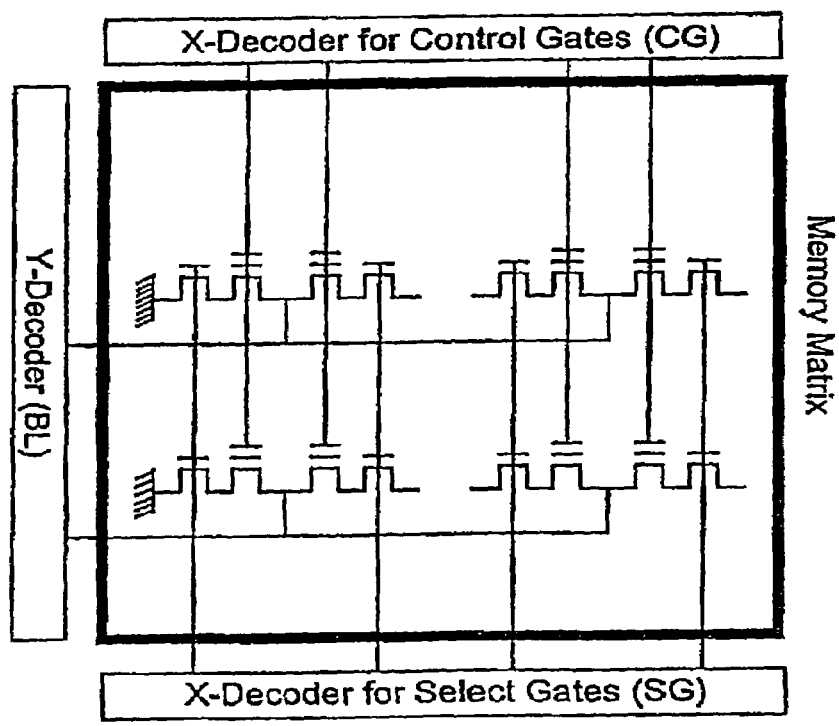
Figure 4A:
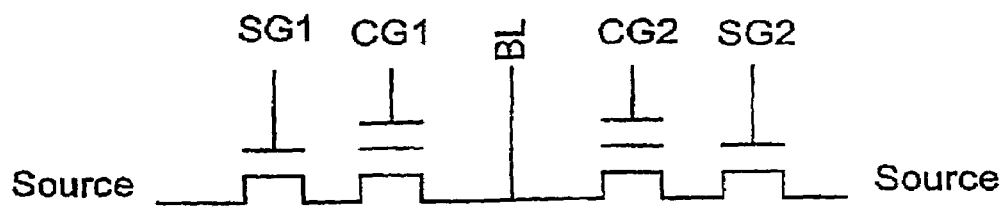
Figures 4B, 5:
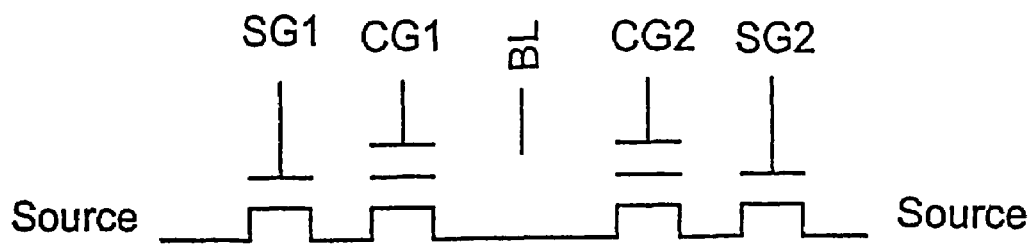

In the following, starting from a prior art approach, the present invention and the way in which it solves the above-identified problem shall be described by way of an embodiment, together with the drawings which show in FIG. 1 the basic layout of a two-transistor non-volatile memory cell;

FIG. 2 the organization of a usual memory matrix;

FIG. 3 the "diagonal test" approach;

FIGS. 4a, 4b the transformation of a non-volatile cell into a ROM cell according to the invention; and FIG. 5 the test of an X decoder with ROM code and a checkerboard pattern.

First, a conventional approach for X and Y decoder testing with a so-called "diagonal" shall be considered.

FIG. 1 depicts how a single non-volatile memory cell is structured and organized, showing a pair of memory cells of such a memory. Each cell consists of a select transistor controlled by a select gate SG on the source side and a storage transistor controlled by a control gate CG. Because of the pairwise arrangement, there are two select gates SG1 and SG2 and two control gates CG1 and CG2 shown in FIG. 1. Information is stored at the floating gate, shown as additional horizontal line, of each storage transistor. The two cells of a pair of cells share the same bitline BL.

When reading the stored information, the corresponding select transistor is "opened" via select gate SG1 or SG2, resp., and thus allows a current to flow from the bitline BL to the current source, "Source" in FIG. 1. When a memory cell is "programmed", current flow will be inhibited by the corresponding floating gate.

FIG. 2 depicts the organization of a usual memory matrix. Only a few of the cells are shown for clarity. The memory matrix is framed by two X decoders, the top one for the control gates CG of the cells, the bottom one for the select gates SG of the cells. At the left of the matrix is a single Y decoder for the bit lines BL, as shown in FIG. 1 above. A single cell is accessed by the corresponding control gate CG, the corresponding select gate SG and the corresponding bitline BL.

FIG. 3 shows the "diagonal test" approach as used already in prior art solutions. When a diagonal as displayed is programmed, i.e. a data pattern entered and read out, and the entire memory is read afterwards, the proper functionality of both, X and Y decoder is completely tested. The disadvantage of this prior art method is that, for the above-given example of a 16 Mb non-volatile memory, 4096 memory words have to be programmed, resulting in a total time of over 20 s testing time, as explained above. As also mentioned above, this is unacceptable in terms of test time.

From Kato U.S. Pat. No. 5,214,604, it is known to couple so-called dummy cells randomly to word lines in a programmable ROM for carrying out a test of the address decoders. However, because of its randomness, this test is just a partial test of any X decoder. Thus, Kato does not solve the issue of a complete decoder test in a reasonable time. Also, the dummy cells have to be programmed, which increases the test time even more.

From Alapat U.S. Pat. No. 5,357,471 it is known to add an extra row and an extra column of memory cells to the regular matrix array and using these extra row and column for test purposes. Alapat's test, however, is incomplete and thus does not guarantee a completely tested functionality of a memory's decoders.

In contrast to the prior art above, the new approach according to the present invention will be described in the following, together with an embodiment.

Very generally, the invention is based on the idea of adding a small ROM part to the nonvolatile memory matrix at preselected positions, preferably on one side of the board, and subsequently testing the appropriate decoder, here the X decoder, by using this newly added, built-in ROM. The novel inventive idea is to transform regular non-volatile memory cells into ROM cells in a simple and straightforward way, preferably by simply removing (or keeping) the bitline contact, thus turning these cells into ROM cells. Further, the number of thus modified cells is limited. This makes the ROM area very efficient as the regularity of the memory pattern is not disturbed and thus manufacturing of the IC kept simple. In the illustrated example, the additional ROM can be implemented with only 0.27% additional area consumption, a number which cannot be reached with dedicated ROM instances. This is one key point of the invention.

The other key point of the invention is the testing itself which in essence consists in writing a predetermined simple pattern, e.g. a checkerboard pattern, into the non-volatile memory and, preferably sequentially, reading out the newly added ROM cells and in particular just the first bit of the non-volatile memory cells.

It will be shown that this new approach is both easy to manufacture, i.e. adds only minimal cost, and provides a perfect means for fast and complete functional testing of the decoders. The test according to the invention is complete also in the sense that it does not only test that a single line is selected—as the prior art does—but it also checks whether the selected one is the correct line.

The pair of non-volatile memory cells of FIG. 1 is again shown in FIGS. 4a and 4b which depict the transformation of a non-volatile cell into a ROM cell according to the invention. Whereas the bitline is connected in FIG. 4a, which figure is identical to FIG. 1, it is deconnected in FIG. 4b. This opening of the bitline is an extremely simple measure whose implementation is straightforward without requiring any manufacturing process modifications of the cell structure or other changes. But it has the desired effect of modifying the cell pair concerned.

By omitting the bitline contact, the pair of two memory cells connected to this bitline are transformed to a permanent logic value of '0'. If the bitline is not removed, the two cells are a logic '1'. Thus, the non-volatile memory matrix, or part of it, may be transformed into a (hard-coded) ROM. Of course, the bits of two neighbouring rows have always the same hard-coded value.

The number of rows and columns of the memory matrix used for ROM coding depends on the total size of the memory matrix. This will be shown and explained in the example further down.

For the person skilled in the art, it is apparent that this method requires the intrinsic (virgin) threshold voltage of a non-volatile cell being $0V<V_{tVirgin}<V_{dd}$. It must be assured that all non-volatile memory cells used for ROM coding fulfill $0V<V_t<V_{dd}$ when performing the proposed X decoder test. Only then is it possible to switch the memory transistor on/off with $V_{eg}=0V/V_{dd}$, $V_{dd}$ being the supply voltage of the chip, e.g. 1.8 V. It is assumed that the non-volatile cells are at an intrinsic threshold level after "fab-out" manufacturing. If not, UV exposure may be applied to set all cells to their intrinsic threshold level.

After implementing the above cell modification and thus establishing the ROM feature according to the invention, the latter is applied to replace the usual diagonal test known from the prior art.

This is depicted in FIG. 5. A part of the memory matrix is ROM coded according to the description above. Since the memory cells are arranged pair-wise, i.e. grouped back to back, two adjacent cells have the same ROM code value, i.e. '0' or '1'. Assuming 4096 rows in the memory, unique numbers must be distributed to 2048 pairs of rows. For coding 2048 different row pairs, 11 additional bits are needed. As a result, 11 additional columns must be added to the original non-volatile memory matrix, resulting in an increase of only 0.27% in area for a 16 Mb memory with 4096 rows and columns.

With this added ROM it is possible to identify just pairs of rows, not single rows yet. But it is only a short step to allow the identification of any single row. With two programming pulses, a checkerboard pattern can be programmed into the memory matrix as depicted in FIG. 5. Now, every single row can be identified by means of the hardcoded row number and the checkerboard pattern. The following description of the testing of the two X decoders shown in FIG. 2 explains that.

The two X decoders in FIG. 2 are tested in the following way:

1a. The X decoder for the select gates SG, i.e. the bottom X decoder, is tested by reading the entire memory. Hereby, all control gates CG are set at $V_{dd}$ by the X decoder for the control gates, $V_{dd}$ being, as explained above, the chip's supply voltage.

1b. The top X decoder to be tested, i.e. the X decoder for the select gates SG, now applies $V_{dd}$ one by one to the select gates SG, i.e. the select gates SG are set to $V_{dd}$ separately. Reading of the ROM and the first bit of the checkerboard pattern in the non-volatile memory occurs through the bitlines BL via the Y decoder.

This completes the testing of the bottom X decoder, i.e. the X decoder for the select gates SG. For testing the top X decoder, the sequence is reversed:

2a. The X decoder for the control gates CG, i.e. the top X decoder, is also tested by reading the entire memory. Hereby, all select gates SG are set to $V_{dd}$ by the bottom X decoder.

2b. Now the top X decoder for the control gates SG applies $V_{dd}$ one by one to the control gates CG, i.e. the control gates SG are set to $V_{dd}$ separately. Reading again occurs through the bitlines BL via the Y decoder.

This completes the testing of the top X decoder, i.e. the X decoder for the control gates CG and thus the testing of both X decoders. If these two read operations are successfully completed, i.e. no error indicated, both X decoders are ok.

If the readout ROM code or the first bit of the checkerboard in the non-volatile memory do not show the values expected according to the selection, an error is indicated. As example, if row 3 in FIG. 5 is selected the readout result must be "1/2". For row 4 it must be "0/2", for row 5 "1/3", and so on. If anything else is read out, an error must be present. As said before, there is a clear and one-to-one relation between the rows and thus the associated decoder and the readout.

The proposed method for testing memory decoders can be particularly beneficially applied for all large non-volatile memories having a long programming time, e.g. non-volatile memories programmed by tunneling.

Though the invention has been shown in a single embodiment only, a person skilled in the art can easily introduce modifications and variations according to the above-described principles without departing from the gist of the invention and the scope of the appended claims.

The invention claimed is:

1. A non-volatile memory comprising:
 a plurality of memory cells including:
  a first pair of memory cells comprising a first bitline that is common to the first pair of memory cells, wherein data can be written to, read from, and rewritten to the first pair of memory cells; and
  a second pair of memory cells comprising a second bitline that is common to the second pair of memory cells, wherein data can only be read from the second pair of memory cells;
  wherein the first pair of memory cells exhibits the same structure as the second pair of memory cells except that the second pair of memory cells is modified compared to the first pair of memory cells according to a modification that includes physically removing at least a portion of the second bitline of the second pair of memory cells from the non-volatile memory, wherein the second pair of memory cells contains the same permanent logic value.

2. The non-volatile memory according to claim 1, wherein the physical removal of the second bitline of the second pair of memory cells from the non-volatile memory results in a hard-coded ROM cell that stores a hard-coded value, wherein the hard-coded value cannot be modified.

3. The non-volatile memory according to claim 1, further including a pair of decoders for controlling associated gates at each pair of the first pair of memory cells and the second pair of memory cells.

4. The non-volatile memory according to claim 3, each pair of memory cells comprising two transistors in series, a select transistor with a select gate and a storage transistor with a floating gate and a control gate, the select transistors of each pair of memory cells being connected to a source, the storage transistors of each pair of memory cells being connected to a common bit line, the select gates being connected to a first decoder and the control gates being connected to a second decoder.

5. The non-volatile memory according to claim 1, wherein the second pair of memory cells is one of a plurality of second pair of memory cells memory cells added to the non-volatile memory, wherein the number of the plurality of second pair of memory cells equals the base-2 logarithm of one-half the number of rows of memory cells in the non-volatile memory.

* * * * *